(12) United States Patent
Kodavanji et al.

(10) Patent No.: US 11,269,973 B2
(45) Date of Patent: Mar. 8, 2022

(54) CROSSBAR ALLOCATION FOR MATRIX-VECTOR MULTIPLICATIONS

(71) Applicant: HEWLETT PACKARD ENTERPRISE DEVELOPMENT LP, Houston, TX (US)

(72) Inventors: Mashood Abdulla Kodavanji, Karnataka (IN); Soumitra Chatterjee, Karnataka (IN); Chinmay Ghosh, Karnataka (IN); Mohan Parthasarathy, Karnataka (IN)

(73) Assignee: Hewlett Packard Enterprise Development LP, Houston, TX (US)

( * ) Notice: Subject to any disclaimer, the term of this patent is extended or adjusted under 35 U.S.C. 154(b) by 11 days.

(21) Appl. No.: 16/860,357

(22) Filed: Apr. 28, 2020

(65) Prior Publication Data

US 2021/0334335 A1    Oct. 28, 2021

(51) Int. Cl.
| | |
|---|---|
| G06F 17/16 | (2006.01) |
| G11C 13/00 | (2006.01) |
| G06F 16/22 | (2019.01) |
| G06K 9/62 | (2022.01) |

(52) U.S. Cl.
CPC .......... G06F 17/16 (2013.01); G06F 16/2255 (2019.01); G06K 9/6215 (2013.01); G11C 13/004 (2013.01)

(58) Field of Classification Search
CPC ... G06F 17/16; G06F 16/2255; G06K 9/6215; G11C 13/004

USPC ........................................................ 708/520
See application file for complete search history.

(56) References Cited

U.S. PATENT DOCUMENTS

| 8,775,495 B2 | 7/2014 | Lumsdaine et al. |
|---|---|---|
| 10,180,928 B2 | 1/2019 | Nurvitadhi et al. |
| 10,482,156 B2 | 11/2019 | Diril et al. |
| 10,726,096 B2* | 7/2020 | Chatterjee .............. G06N 3/063 |
| 2017/0280144 A1* | 9/2017 | Dvir ..................... H04N 19/174 |
| 2020/0380384 A1* | 12/2020 | Karunaratne .......... G06N 20/10 |

FOREIGN PATENT DOCUMENTS

| CN | 108140016 | 6/2018 |
|---|---|---|
| CN | 109472350 | 3/2019 |

OTHER PUBLICATIONS

Donglin Chen et al., "Optimizing Sparse Matrix-Vector Multiplications on an ARMv8-based Many-Core Architecture," Jan. 1, 2019, pp. 1-22.
Hu, Miao, et al.; "Dot-Product Engine for Neuromorphic Computing: Programming 1T1M Crossbar to Accelerate Matrix-Vector Multiplication"; Hewlett Packard Labs; Copyright 2016; 7 pp.
Mehmet Belgin, "Structure-based Optimizations for Sparse Matrix-vector Multiply," Dec. 14, 2010, pp. 1-193.
(Continued)

*Primary Examiner* — Tan V Mai
(74) *Attorney, Agent, or Firm* — Trop, Pruner & Hu, P.C.

(57) ABSTRACT

Repeating patterns are identified in a matrix. Based on the identification of the repeating patterns, instructions are generated, which are executable by processing cores of a dot product engine to allocate analog multiplication crossbars of the dot product engine to perform multiplication of the matrix with a vector.

20 Claims, 9 Drawing Sheets

(56) References Cited

OTHER PUBLICATIONS

Strachan, John Paul; "The Dot-Product Engine (DPE): exploring high efficiency analog multiplication with memristor arrays"; Hewlett Packard Labs; Dec. 11, 2015; 29 pp.

Yang et al., "SNAP network: Orkut social network and ground-truth communities", available online at <https://sparse.tamu.edu/SNAP/com-Orkut>, Texas A&M University, Computer Science & Engineering Department, 2012, 2 pages.

* cited by examiner

CROSSBAR ALLOCATION FOR MATRIX-VECTOR MULTIPLICATIONS

BACKGROUND

An ever-increasing number of hardware platforms are being used to develop, train and deploy neural network models. The execution of a neural network model for training, testing or inference may involve a considerable number of matrix-vector multiplications. Because the matrix-vector multiplications may involve multiplying matrices that each have thousands, if not hundreds of thousands, of rows and columns, the matrix-vector multiplications may consume a significant amount of computing and memory resources of a hardware platform.

DETAILED DESCRIPTION

Because matrix-vector multiplications (e.g., multiplications arising from neural network model execution) may be a challenging task for general purpose processing cores, a hardware platform may contain one or multiple co-processors or accelerators that are specifically designed to handle these multiplications. For example, the hardware platform may contain a digital signal processor that executes vector processing algorithms in the digital domain to perform matrix-vector multiplications. In accordance with example implementations that are described herein, a hardware platform uses a memristor array-based crossbar (also called an "analog multiplication crossbar" herein) to perform matrix-vector multiplications in the analog domain. The memristor array has a natural current accumulation feature, which allows the matrix-vector multiplication to be orders of magnitude more efficient than digital domain-based multiplication techniques. Moreover, as described herein, in accordance with example implementations, memristor array-based crossbars are allocated in a resource conserving process that identifies repeating submatrix patterns and assigns non-identical submatrices to the crossbars based on this identification.

The memristor array of a memristor array-based crossbar includes row lines and column lines, and at each row line-column line cross point, an electrically conductive element, which has a programable conductance value, connects the row line to the column line. As such, each of these programable elements is associated with a row line and a column line. For matrix-vector multiplication involving an input matrix and an input vector, the conductance values are programmed to correspond to the element values of the input matrix. The row lines of the memristor array receive analog voltages that correspond to and represent the elements, or segments, of the input vector. For each conductance value that is connected to a given column line, a current that is equal to the product of the associated row voltage and the conductance value is injected into the column line. These injected currents accumulate such that the current in each column line represents a dot product of the input vector and a different row vector of the input matrix. Stated differently, each column line corresponds to a different element, or segment, of an output vector (i.e., the input matrix-input vector multiplication product), and the current in the column line represents the value of the segment. The memristor array-based crossbar may include transimpedance amplifiers to convert the column currents into analog voltages that represent the elements of the output vector.

Matrix-vector multiplication, such as the matrix-vector multiplication used in the execution of neural network models, may involve multiplying considerably large matrices, which may contain thousands, if not hundreds of thousands (if not more), of rows and columns. Such a large matrix may greatly exceed the size of a memristor array-based crossbar. To accommodate such large matrix sizes, partitioning may be used such that a given matrix-vector multiplication may be computed as a combination of smaller matrix-vector products, with memristor array-based crossbars being used to determine the smaller matrix-vector products. For example, an input matrix may be partitioned into a number of M×M (where "M" is an integer) matrix partitions; and the input vector may be partitioned into M vector partitions. This partitioning produces a number of matrix-vector multiplication operations (i.e., each operation involving the multiplication of an M×M matrix with an M element vector), with the corresponding products being combined to provide the segments of the output vector. One way to compute the matrix-vector multiplication in this manner may be is to assign each of the matrix-vector multiplication operations to a different crossbar.

In accordance with example implementations that are described herein, a dot product engine (DPE) may have an architecture that includes multiple cores. In accordance with example implementations, a given core may include a processing core, signal conditioning circuitry (e.g., analog-to-digital converters (ADCs), digital-to-analog converters (DACs) and transimpedance amplifiers) and a set of analog multiplication crossbars (e.g., memristor array-based multiplication crossbars). Each processing core may execute instructions to set up and read the results of product operations using its associated analog multiplication crossbars. In general, to perform a given matrix-vector multiplication, multiple, if not all, of the processing cores of the DPE may be assigned to determining sub-products, which are combined, to generate the output vector representing the result of the matrix-vector multiplication.

The allocation of the matrix-vector multiplication operations may be controlled through machine executable instructions (or "software"), which are generated by a compiler and loaded into the DPE for execution by the processing cores. In general, the instructions that are generated by the compiler assigns the product operations to the processing cores and various analog multiplication crossbars; and the corresponding instructions are executed by the processing cores for purposes of programming the analog multiplication crossbars with matrix values, moving input vector data into the analog multiplication crossbars, reading output vector data from the analog multiplication crossbars, and combining the products produced by the crossbars to form an output vector that represents the matrix-vector multiplication product.

In accordance with example implementations that are described herein, the compiler allocates (via its generated executable instructions) the analog multiplication crossbars to take advantage of repeating matrix patterns (called "repeating patterns" or "repeating submatrix patterns" herein) by assigning the same crossbars to determine products involving the same matrix patterns. This enables large scale matrix-vector multiplication, which may otherwise be difficult, if not impossible to achieve given a specific device configuration. Moreover, as described herein, in accordance with example implementations, in addition to identifying repeating submatrix patterns, the compiler may identify specific submatrix patterns, such as identity matrices and zero matrices, which, as described herein, is used by the compiler to reduce the number of analog multiplication crossbar-based multiplications. Additionally, in accordance with example implementations, the compiler recognizes product operations that share the same matrix and vector operands, such that the product for a repeating matrix operand-vector operand pair may be stored and reused without analog multiplication crossbars being allocated to perform repetitive multiplication operations.

Figure 1:
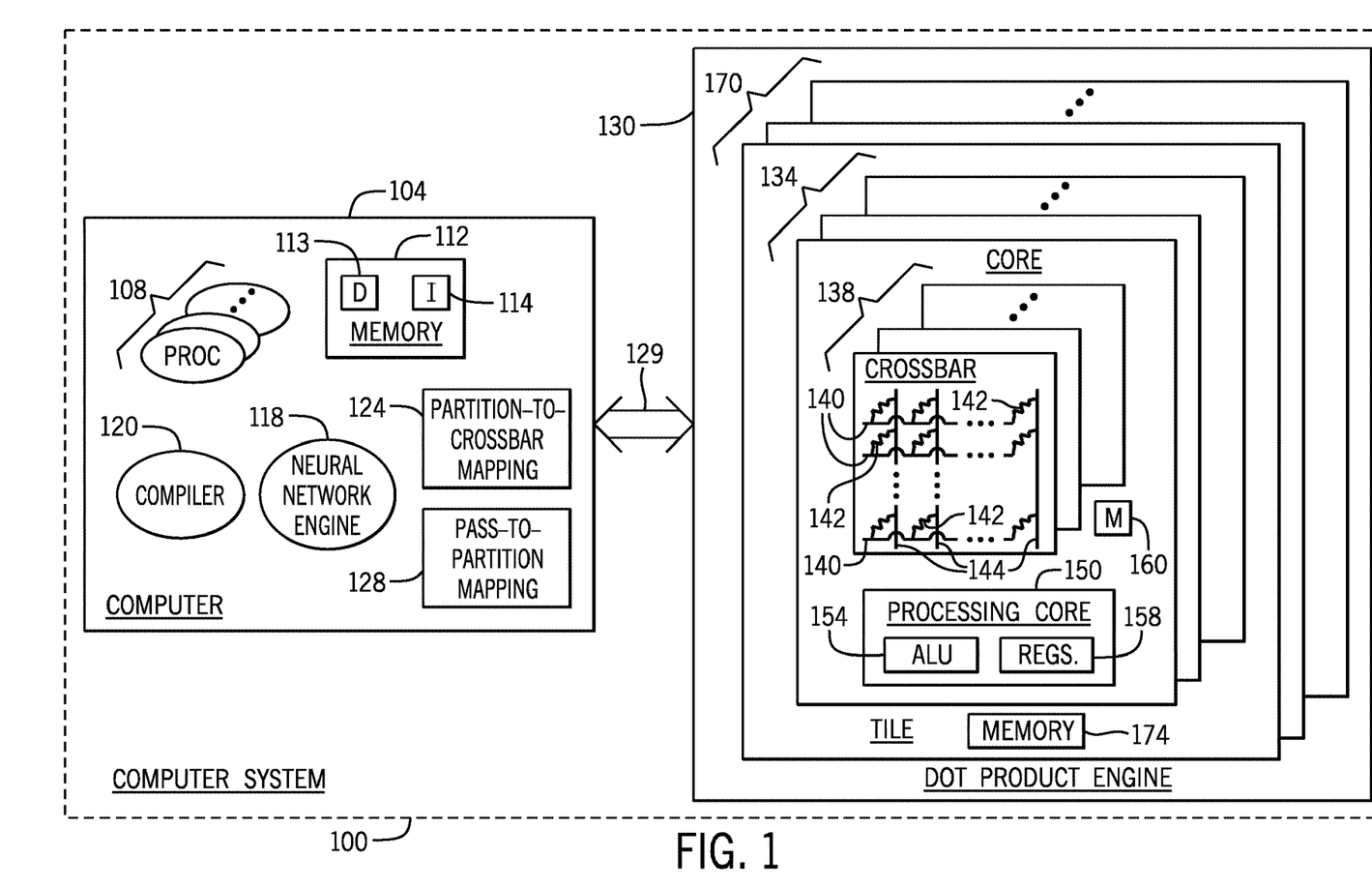
FIG. 1 is a schematic diagram of a computer system having a dot product engine (DPE) and a compiler to generate instructions for execution by the DPE according to an example implementation.

Referring to FIG. 1, as a more specific example, in accordance with some implementations, a computer system 100 includes a compiler 120, which generates machine executable instructions (i.e., "software") to control matrix-vector multiplication by an accelerator, or dot product engine (DPE) 130. As examples, the computer system 100 may be any of a number of processor-based hardware platforms, such as a desktop computer, a laptop computer, rack-based server module, an edge computing system, a tablet computer, a server, a client, a smart phone, a wearable computer, and so forth.

In general, the DPE 130 executes the instructions that are provided by the compiler 120 to multiply an input matrix by an input vector to provide an output vector. In accordance with example implementations, the compiler 120 partitions the input vector and partitions the input matrix to form associated matrix partition-vector partition multiplications. In accordance with example implementations, each matrix partition-vector partition multiplication has a set of product operations, with each product operation corresponding to the two-dimensional size of a crossbar 138 of the DPE 130. The compiler 120, in accordance with example implementations, assigns the product operations to various analog multiplication crossbars 138 of the DPE 130, and as further described herein, the compiler 120 allocates the crossbars 138 based on repeating submatrix patterns that are identified by the compiler 120.

Figure 2:
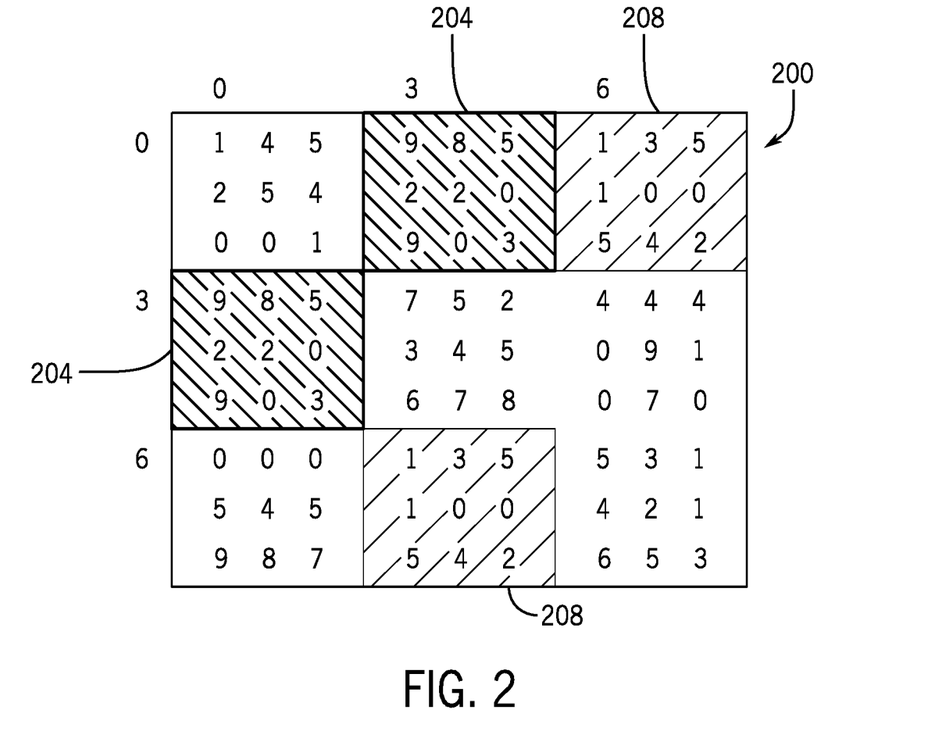
FIG. 2 is an illustration of a matrix having repeating submatrix patterns according to an example implementation.

FIG. 2 represents an example input matrix 200 that has multiple repeating submatrix patterns. It is noted that for clarity purposes, the input matrix 200 is relatively small (i.e., a nine column by nine row (9×9) matrix), with it being understood that an actual input matrix processed by the DPE 130 (FIG. 1) may have thousands, hundreds of thousands, or even more rows and columns. Moreover, for the following discussion, also for purposes of clarity, it is assumed that the two-dimensional analog multiplication crossbar size, M×M, is a relatively small 3×3 size, with it being understood that "M" may be on the order of tens or hundreds.

Referring to FIG. 2 in conjunction with FIG. 1, the input matrix 200 has two repeating submatrix patterns: a repeating submatrix pattern that has two instances 204 and another repeating submatrix pattern that has two instances 208. It is noted that although repeating instances of "two" are depicted in connection with FIG. 2, a given repeating pattern may have more than two instances, especially in a large matrix. Moreover, repeating submatrix patterns for a given matrix may have varying number of repeating instances, and the submatrix patterns for a given matrix may have varying dimensions.

In general, the compiler 120, in its generation of instructions for the DPE 130, assigns a given submatrix, or matrix partition, to a given crossbar 138. For the example that is depicted in FIG. 2, the input matrix 200 is partitioned into nine, M×M (here, 3×3) matrix partitions; and the input vector (not shown) is also partitioned into M (three for this example) partitions. In accordance with example implementations, the compiler 120 recognizes, or identifies, the repeating submatrix patterns of the matrix 200; and the compiler 120 generates instructions for the DPE 130 that designate a single analog multiplication crossbar 138 to process the matrix partition-vector partitions that correspond to the two instances 204 and designates another, single analog multiplication crossbar 138 to process the matrix partition-vector partitions that correspond to the two instances 208. In accordance with example implementations, using the same analog multiplication crossbar 138 to process multiple matrix-vector products for the same matrix partition saves computing and memory resources, as the crossbar 138 is programmed with the matrix values once (and thus, not reprogrammed with the same matrix values for each product operation that corresponds to the same matrix).

Referring back to FIG. 1, in accordance with some implementations, the analog multiplication crossbar 138 may be a memristor array-based crossbar having a cross point array of row lines 140 and column lines 144. Each cross point is associated with a conductance element 142, which couples one of the row lines 140 to one of the column lines 144. The conductance values of the conductance elements 142 correspond to the two-dimensional matrix partition that is being multiplied by the analog multiplication crossbar 138. In accordance with example implementations, the row lines 140 receive analog voltages that correspond to the elements, or segments, of the vector partition that is being multiplied by the analog multiplication crossbar 138; and each column line 144 provides a current that represents a dot product of the vector partition and a different row vector of the matrix partition that is being multiplied by the crossbar 138. Therefore, the current in the column line represents the value of an element, or segment, of a product vector that is produced by the analog multiplication crossbar 138; and this product vector represents the product of a matrix partition and a vector partition. Although not depicted in FIG. 1, in accordance with example implementations, the analog multiplication crossbar 138 may include transimpedance amplifiers to convert the column currents into analog voltages, such that each analog voltage represents the value of an element of the product vector that is produced by the crossbar 138.

In general, due to the partitioning of the input vector and input matrix, the product vector that is provided by a given analog multiplication crossbar 138 is a portion, or subsegment, of a segment of the output vector. As such, each segment of the output vector may be a summation of a number of subsegments, where each subsegment is provided by a particular crossbar 138.

In accordance with example implementations, the DPE 130 may include multiple cores 134, where each core 134 includes a processing core 150 and multiple analog multiplication crossbars 138. In general, through its generated instructions, the compiler 120 may allocate numerous matrix partition-vector partition multiplications to a given processing core 150. For the purpose of performing its assigned matrix partition-vector partition multiplication operations, the processing core 150 may include an arithmetic logic unit (ALU) 154 and input/output (I/O) registers 158. The core 134 may also include signal conditioning circuitry, such as ADCs and DACs for purposes of converting digital input values into analog voltages, and vice versa. For example, in accordance with example implementations, the core 134 may include an ADCs to convert voltages that are provided by transimpedance amplifiers (which, in turn, convert the crossbar column line currents into voltages) into digital values that represent the voltages; and the core 134 may include DACs to convert data represent elements of input vectors into voltages that are provided to the crossbar row lines. In general, the I/O registers 158 allow the processing core 150 to program matrix values into its associated analog multiplication crossbars 138, provide input partition vectors to the crossbars 138, read data representing the product vectors produced by the crossbars 138, and so forth.

In accordance with some implementations, the dot product engine 130 may have an architecture in which multiple cores 134 are disposed on a tile 170, and the cores 134 of a given tile 170 may share a memory 174. In accordance with some implementations, the memory 174 may store, for example, data representing input matrix partition values, input vector partition values, product vector values; output vector segment values, output vector subsegment values, and so forth. In accordance with some implementations, the dot product engine 130 may be disposed in a semiconductor package (or "chip"). For example, in accordance with some implementations, the semiconductor package may contain multiple die, where each die may contain a particular tile 170. Moreover, in accordance with some implementations, the tiles 170 may be in communication through network communication paths of the semiconductor package.

In accordance with example implementations, the compiler 120 may be formed by machine executable instructions (or "software") that are executed by a processing resource of a machine. More specifically, as depicted in FIG. 1, in accordance with example implementations, a computer 104 may contain various hardware components, such as one or multiple hardware processors 108 and a memory 112. In general, the processors 108 may be any type of processing resource, such as one or multiple central processing units (CPUs), one or multiple CPU processing cores, microcontrollers, and so forth. Moreover, the memory 112 may be formed from non-transitory storage devices, such as semiconductor storage devices, memristor devices, phase change memory devices, volatile memory devices, non-volatile memory devices, a combination of one or more of the foregoing storage technologies, and so forth.

In general, the memory 112 may store machine executable instructions 114 that, when executed by one or multiple processors 108, cause the processor(s) to form the compiler 120. Moreover, the memory 112 may store data 113, such as data representing input vectors and input matrices; preliminary, intermediate and final results involved in the processing operations by the compiler 120; identified repeating submatrix patterns; matrix partitions associated with repeating submatrix patterns; matrix partitions; vector partitions; signatures of matrix partitions (as further described herein); data structures, such as structures 124 and 128, used in the generation of instructions by the compiler 120 (as further described herein); variables generated due to the execution of a neural network engine 118, and so forth. Moreover, as depicted in FIG. 1, in accordance with some implementations, the computer may have various other software, such as the neural network engine 118, which may, for example, in accordance with some implementations, request vector-matrix multiplications; and in response to these requests, the compiler 120 may generate instructions to cause the processing cores 150 to perform the operations to produce the corresponding matrix-vector multiplication products.

Figure 3A:
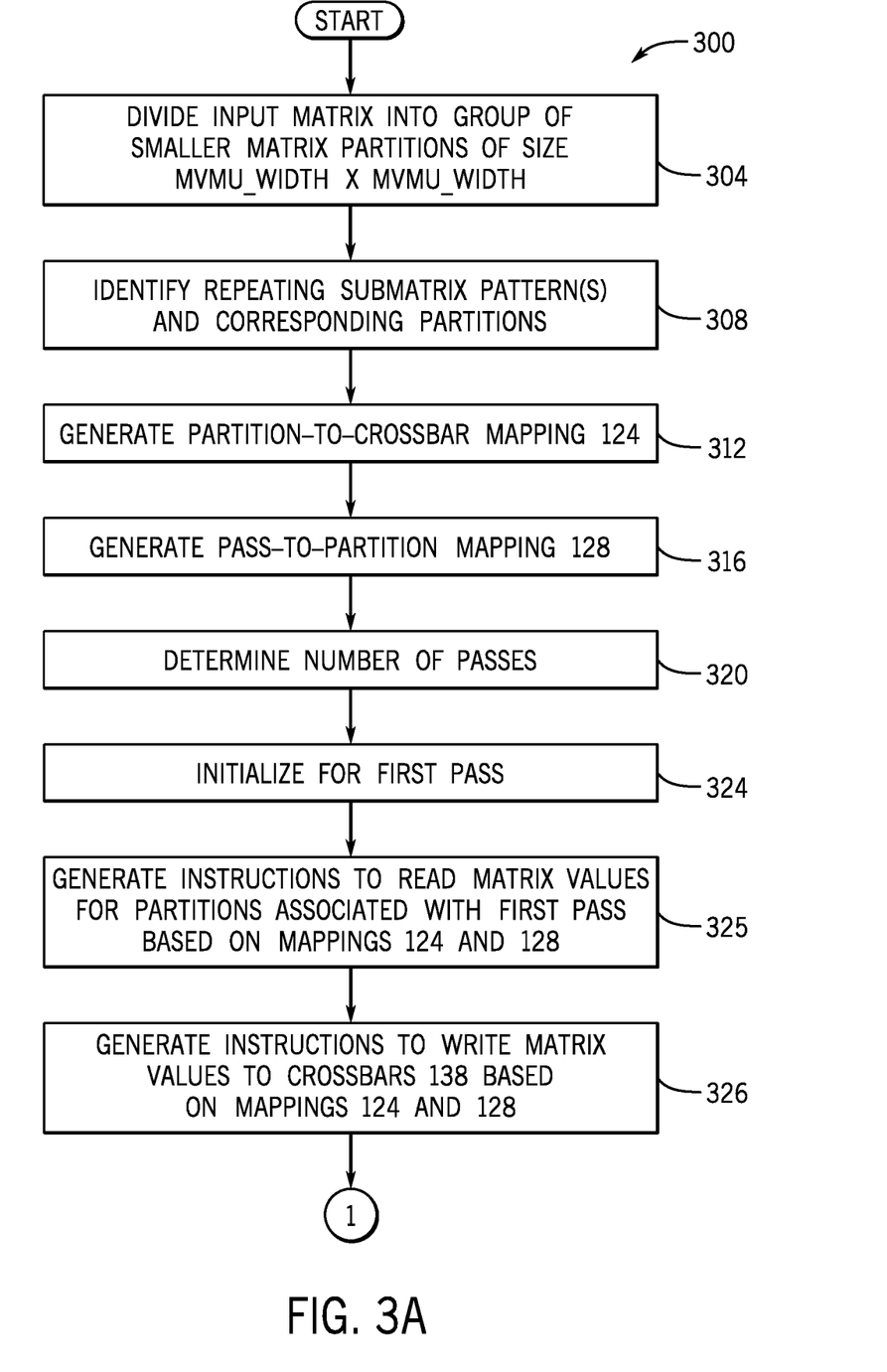
FIGS. 3A and 3B are flow diagrams depicting a process to compile instructions for the DPE of FIG. 1 in a manner that optimizes crossbar allocation according to an example implementation.
Figure 3B:
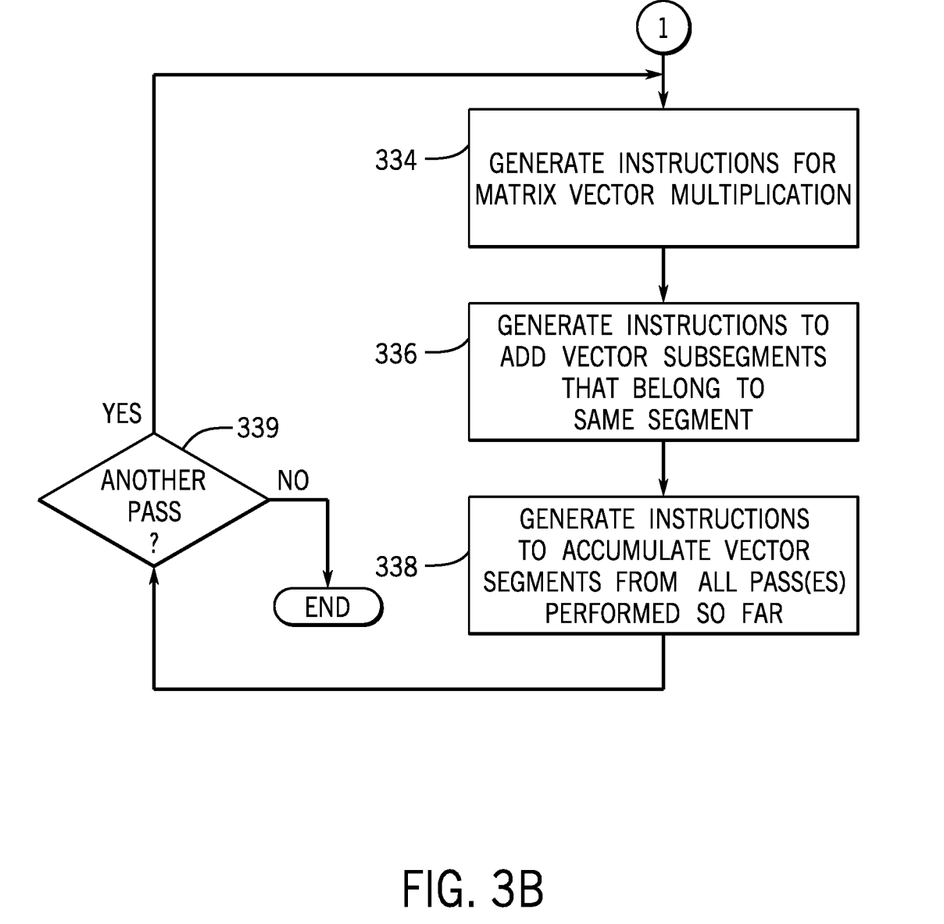

FIGS. 3A and 3B depict a process used by the compiler 120 to generate instructions for the processing cores 150 in accordance with example implementations. For this specific example, the process 300 is simplified to illustrate the generation of instructions for the DPE 130 to process a particular input matrix-input vector multiplication, with, for purposes of clarity, the assignment of the instructions to specific processing cores 150 being omitted. In accordance with some implementations, the process 300 may generate instructions for one or multiple processing cores 150.

Referring to FIG. 3A in conjunction with FIG. 1, in accordance with example implementations, the compiler 120 divides (block 304) the input matrix into a group of relatively smaller partitions having a size of a predetermined number (MVMU_WIDTH) of columns by a predetermined number (MVMU_WIDTH) of rows. Using the simplified matrix 200 of FIG. 2 as an example, the MVMU WIDTH parameter may be "3," such that the matrix partitions have a size of 3×3.

Next, pursuant to block 308, the compiler 120 processes the matrix partitions to identify any repeating submatrix patterns and note the corresponding matrix partitions in which these patterns are present. Referring to the example matrix 200 of FIG. 2, the compiler 120 may, for example, identify the repeating submatrix pattern associated with the instances 204 and note the corresponding matrix partitions (i.e., the matrix partition having a starting row of "0" and a starting column of "3" and another matrix partition having a starting row of "3" and a starting column of "0"). In a similar manner, the compiler 120 may identify the repeating submatrix pattern associated with the instances 208 and note the corresponding starting row and column values for the corresponding matrix partitions.

In accordance with example implementations, the compiler 120 sets up two data structures, a partition-to-crossbar mapping 124 and a pass-to-partition mapping 128, to guide the compiler 120 in the allocation of the analog multiplication crossbars 138. More specifically, in accordance with example implementations, as depicted in block 312, the compiler 120 generates the partition-to-crossbar mapping 124. In accordance with example implementations, to multiply a given input matrix and input vector, the analog multiplication crossbars 138 operate in "passes." A "pass" refers to a round, or iteration, in which a set of analog multiplication crossbars 138 provide product vectors, and one or multiple analog multiplication crossbars 138 programmed with the same matrix values may be used in more than one pass, or iteration. In accordance with example implementations, each entry of the partition-to-crossbar mapping 124 assigns a specific matrix partition to a specific analog multiplication crossbar 138 for a specific pass.

The entries of the partition-to-crossbar mapping 124, in accordance with example implementations, may have the following form: [row, column, crossbar, count]. Here, "row" and "column" identify a particular matrix partition: "row" represents the starting row of the matrix partition; and "column" represents the starting column of the matrix partition. "Crossbar" represents an identifier of a particular analog multiplication crossbar 138 that is assigned by the compiler 120 to the matrix partition; and "count" represents a "pass" in which the matrix partition is processed by the assigned analog multiplication crossbar 138. As examples, a count of "1," in accordance with example implementations, means that the matrix partition is to be processed by the identified crossbar 138 in the first pass, a count of "2" means that the matrix partition is to be processed by the identified crossbar 138 next (in the second pass), a count of "3" means that the matrix partition is to be processed by the crossbar 138 in pass number 3, and so forth.

As a more specific example, for the example matrix 200 of FIG. 2, the corresponding partition-to-crossbar mapping 124 might be as follows:

[0,0,XBAR1,1] [0,3,XBAR2,1] [0,6,XBAR3,1]
[3,0,XBAR2,2] [3,3,XBAR4,1] [3,6,XBAR5,1]
[6,0,XBAR6,1] [6,3,XBAR3,2] [6,6,XBAR7,1]

For this example, the entries "[0,3,XBAR2,1]" and "[3,0,XBAR2,2]" correspond to the instances 204. The "[0,3,XBAR2,1]" entry represents that the analog multiplication crossbar 138 corresponding to the XBAR2 identifier is to be used in pass number one to determine a product with the matrix partition beginning at row "0" and column "3" (i.e., the matrix partition corresponding to one of the instances 204). The "[3,0,XBAR2,2]" entry designates that the matrix partition corresponding to a starting row of "3" and a starting column of "0" (i.e., the matrix partition corresponding to the other instance 204) is to be processed in pass number two using the same crossbar XBAR2. It is noted that in the first pass, the XBAR2 crossbar is loaded, or programmed, with the matrix values corresponding to the identified matrix partition. However, in the subsequent second pass, the matrix values are not loaded into the XBAR2 crossbar, as these matrix values have already been programmed into the XBAR2 crossbar to perform the product operation associated with the first pass. Thus, although the products that are produced by the XBAR2 crossbar in the first and second pass may differ (due to different input vector partitions), the matrix partition remains the same, so that memory and computing resources are not consumed reloading the XBAR2 crossbar with matrix values for the second pass.

Pursuant to block 316 of the process 300, the compiler 120 further generates a pass-to-partition mapping 128. The pass-to-partition mapping 128 is a data structure that is used by the compiler 120 for purposes of tracking the matrix partitions that are multiplied in each pass. More specifically, in accordance with example implementations, the pass partition mapping 128 stores entries, where each entry corresponds to a particular pass number, and the entry contains pointers to the partition-to-crossbar mapping 124 to identify the particular matrix partitions that correspond to the pass.

For the example above, the pass-to-partition mapping 128 may contain the following two entries: Passes[1]=[1,2,3,5, 6,7,9], and Passes[2]=[4, 8]. The first entry, Passes[1], identifies pointers to entries 1, 2, 3, 5, 6, 7 and 9 of the partition-to-crossbar mapping 124 that is set forth above, i.e., matrix partitions that are processed in the first pass. The second entry, Passes[2], represents that entries 4 and 8 of the partition-to-crossbar mapping 124 are processed in the second pass. In other words, for this example, the XBAR2 and XBAR3 crossbars are reused in the second pass, without reprogramming, or reloading, these crossbars with matrix values.

Pursuant to block 320 of the process 300, the compiler 120 determines the number of passes, i.e., the number of iterations that are used to multiply the input matrix by the input vector. In accordance with example implementations, this number is the maximum number of instances of any repeating submatrix pattern in the matrix. For the example above, the number of passes is "2." Pursuant to block 324, the compiler 120 then initializes for a first pass before beginning an iterative process, in which each iteration pertains to a particular pass.

In the first pass, the compiler 120 generates (block 325) instructions to read matrix values for the partitions associated with task number one based on the partition-to-crossbar mapping 124 and the pass-to-partition mapping 128. Next, pursuant to block 326, the compiler 120 generates instructions to write matrix values to the crossbars 138 based on the mappings 124 and 128. It is noted that, in accordance with example implementations, the compiler 120 does not perform blocks 325 and 326 for subsequent passes (i.e., for pass number two and greater), as for these subsequent passes, crossbars 138 are reused.

FIG. 3B depicts actions by the compiler 120 for the remainder of pass number one and the actions performed by the compiler 120 for other subsequent passes. Referring to FIG. 3B in conjunction with FIG. 1, pursuant to block 334, the compiler 120 generates instructions for matrix vector multiplication. Pursuant to block 336, the compiler 120 generates instructions to add vector subsegments, which belong to the same segment. Pursuant to block 338, the compiler 120 accumulates like vector subsegments produced during all passes so far. As depicted in decision block 339 of FIG. 3B, the compiler 120 evaluates whether another pass is to be performed, and if so, the compiler 120 performs another iteration (beginning at block 334) to generate instructions for the next pass. Otherwise the multiplication of the input vector and input matrix is complete, and the accumulated vector subsegments represent the segments of the output vector.

For the above example, after the first pass, the partially-determined segments of the output vector are as follows:

Segment 1=$XBAR1*v1+XBAR2*v2+XBAR3*v3$

Segment 2=$XBAR4*v2+XBAR5*v3$

Segment 3=$XBAR6*v1+XBAR7*v3$

Here, "Segment 1," "Segment 2" and "Segment 3" represent three segments of the output vector; and "v1," "v2" and "v3" represent segments of the input vector. In the he second pass, the remaining subsegment $XBAR2*v1$ of Segment 2 and the remaining subsegment XBAR3*v2 of Segment 3 are determined accumulated with the pass one results as follows:

Segment 1=XBAR1*v1+XBAR2*v2+XBAR3*v3

Segment 2=XBAR4*v2+XBAR5*v3+XBAR2*v1

Segment 3=XBAR6*v1+XBAR7*v3+XBAR3*v2

In accordance with some implementations, the compiler 120 identifies repeating submatrix patterns in a process that involves first calculating hash values for each matrix partition, using the hash values to filter the matrix partitions such that the compiler 120 derives a reduced set of matrix partitions that may contain repeating submatrix patterns, and then performing a matrix element-by-matrix element comparison to identify any repeating submatrix patterns in this reduced, filtered set.

Figure 4:
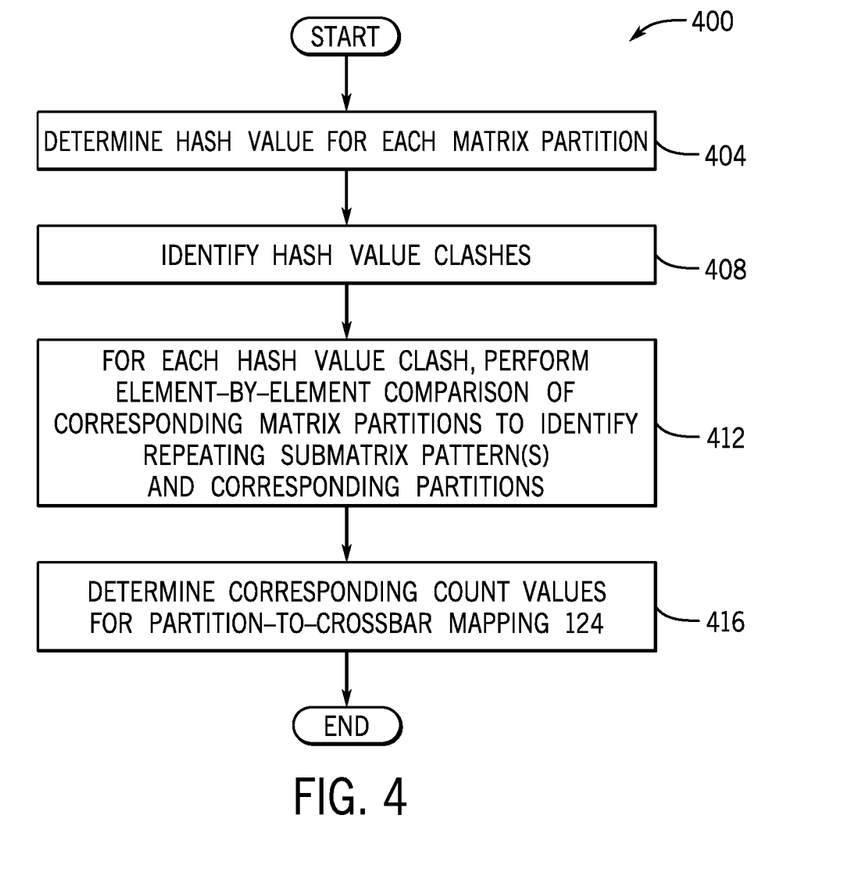
FIG. 4 is a flow diagram depicting a process used by the compiler to identify repeating submatrix patterns of a matrix according to an example implementation.

More specifically, referring to FIG. 4 in conjunction with FIG. 1, in accordance with example implementations, the compiler 120 may use a process 400 to identify repeating submatrix patterns and set the count values in the partition-to-crossbar mapping 124 for each of these identified patterns. Pursuant to the process 400, the compiler 120 first determines (block 404) a hash value for each partition of the input matrix.

In this context, a "hash," or "hash value," refers to a value that is produced by the application of a cryptographic hash function to an input (e.g., a binary image of a given unit of code) to produce the hash. In this manner, a cryptographic hash function may be applied, or performed, by a processor executing machine-executable instructions ("software") to receive an input and produce an output (the "hash") that corresponds to the input. Any minute change to the input may alter the hash. As examples, the cryptographic hash function may be a signed hash function (SHA), any federal information processing standards (FIPS) approved hash function, any national institute of standards and technology (NIST) approved hash function, or any other cryptographic hash function. Moreover, in accordance with further example implementations, a cryptographic hash function may be a function that is applied, or performed, by a hardware circuit (e.g., an application specific integrated circuit (ASIC), a field programmable gate array (FPGA), and so forth) without executing machine-executable instructions.

It is noted that any of a number of hash algorithms may be used, in accordance with the various implementations, with the more selective hashing algorithms being a tradeoff between consuming time/resources in performing the hash algorithm and saving time from comparing matrix partitions that are not matches. In accordance with example implementations, pursuant to block 408, the compiler 120 identifies any hash value clashes. In this context, in accordance with example implementations, a "hash value clash" occurs between a given pair of matrix partitions when their corresponding hash values are the same.

Pursuant to block 412, for each hash value clash, in accordance with example implementations, the compiler 120 performs an element-by-element comparison of the corresponding pair of matrix partitions to identify repeating submatrix pattern(s) and the corresponding matrix partitions. In other words, if, for example, a pair of hash values clash, then the compiler 120 performs an element-by-element comparison of the values of the pair of matrix partitions, and if all of the matrix elements match, or are the same, then the two matrix partitions are deemed to be instances of the same repeating submatrix pattern. Pursuant to block 416, the compiler 120 then determines the count values for the partition-to-crossbar mapping 124.

Figure 5:
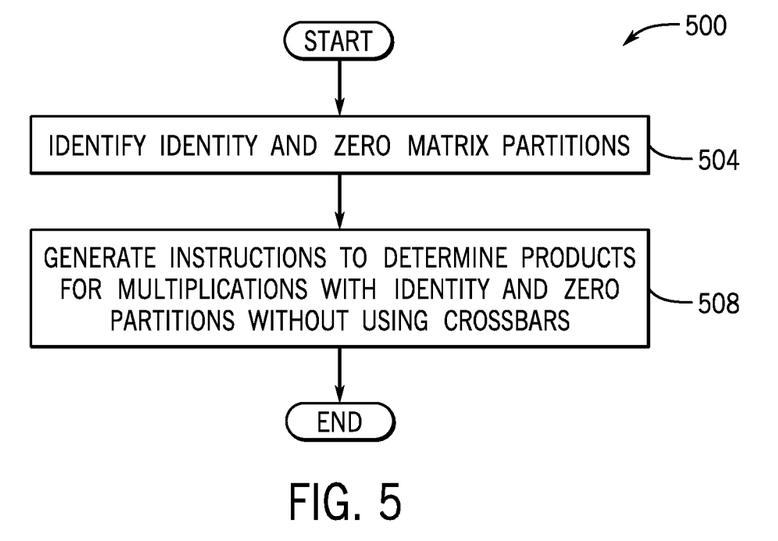
FIG. 5 is a flow diagram of a process used by the compiler to generate instructions for the DPE for multiplications involving identity and zero matrices according to an example implementation.

In accordance with some implementations, the compiler 120 may perform other optimizations by recognizing certain matrix partitions and generating corresponding instructions to apply optimizations for these matrices. In this manner, referring to FIG. 5, in accordance with some implementations, the compiler 120 may perform a process 500 that includes identifying (block 504) any identity or zero matrix partitions for purposes of eliminating corresponding crossbar product operations. In this manner, if a matrix partition is the identity matrix, then, in lieu of loading, or programming, a crossbar 138 with the identity matrix, the compiler 120 generates instructions to use the input vector partition as the output (i.e., the product of the input vector partition and the identity matrix is the input vector partition). If the matrix partition is a zero matrix, then the compiler 120 stores the resulting product as a zero vector, in lieu of loading, or programming, a crossbar with the zero matrix. Therefore, pursuant to block 508, the compiler 120 generates instructions to determine the products for multiplications that involve identity and zero partitions without using crossbars.

Figure 6:
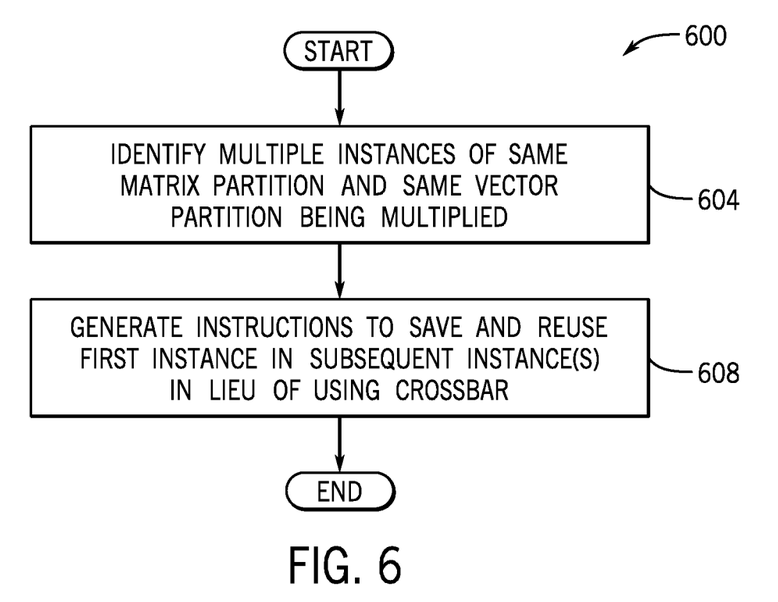
FIG. 6 is a flow diagram of a process used by the compiler to generate instructions for the DPE for multiple multiplication instances of the same matrix partition and vector partition according to an example implementation.

The compiler 120 may further apply optimizations when the same matrix and vector operands appear. In this manner, referring to FIG. 6, in a process 600, the compiler 120 identifies (block 604) multiple instances of the same matrix partition and the same vector partition being multiplied. The compiler 120 generates (block 608) instructions to save and reuse the first instance in the one or multiple subsequent instances in lieu of using an analog multiplication crossbar 138.

Figure 7:
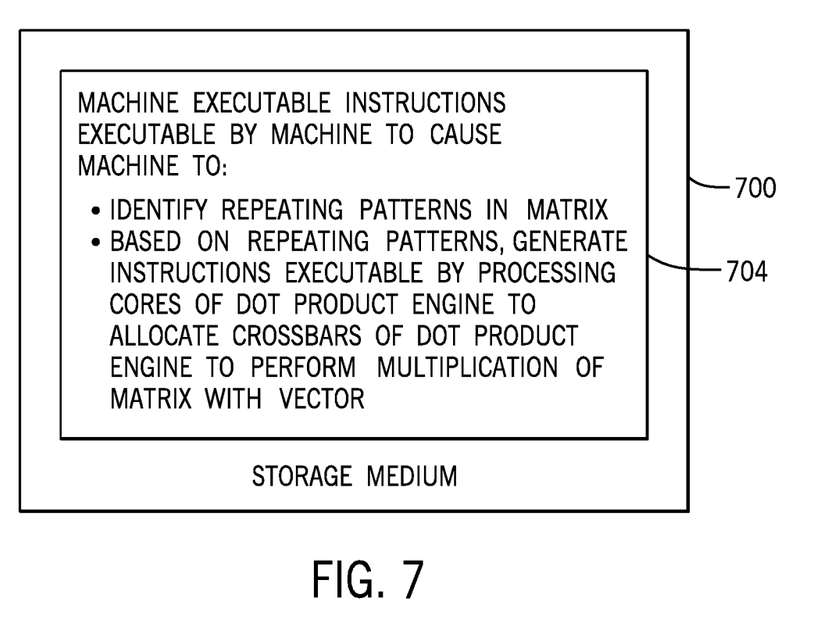
FIG. 7 is an illustration of machine executable instructions stored on a non-transitory storage medium to allocate analog multiplication crossbars of a dot product engine according to an example implementation.

Referring to FIG. 7, in accordance with example implementations, a non-transitory storage medium 700 stores machine-readable instructions 704. The instructions 704, when executed by a machine, cause the machine to identify repeating patterns in a matrix; and based on the identification, generate instructions that are executable by processing cores of a dot product engine to allocate analog multiplication crossbars of the dot product engine to perform multiplication of the matrix with a vector.

Figure 8:
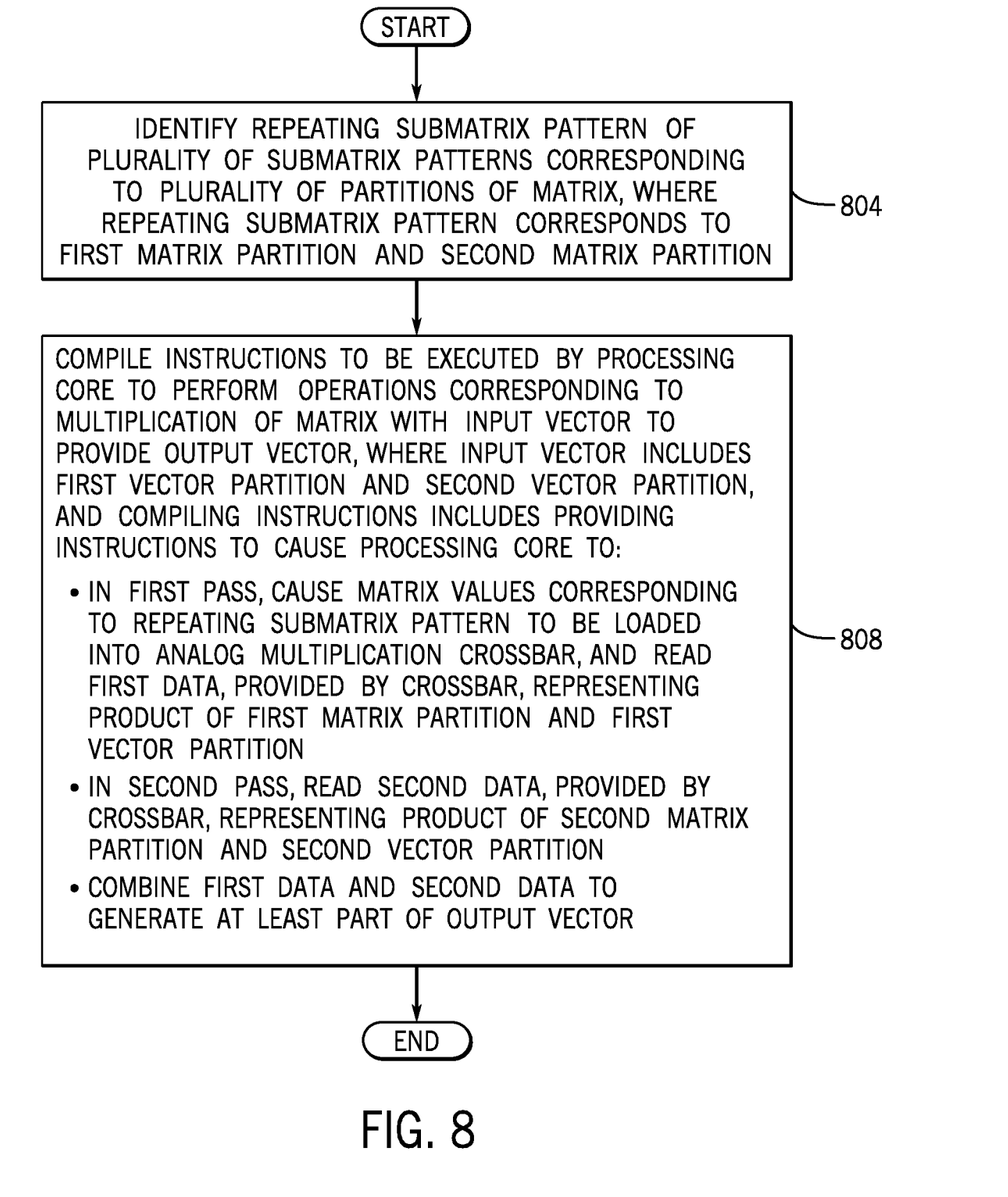
FIG. 8 is a flow diagram depicting a process to compile instructions to be executed by a processing core to perform operations corresponding to the multiplication of a matrix with a vector for the case in which the matrix has partitions having repeating submatrix patterns according to an example implementation.

Referring to FIG. 8, in accordance with example implementations, a technique 800 includes identifying (block 804) a repeating submatrix pattern of a plurality of submatrix patterns corresponding to a plurality of matrix partitions of a matrix. The repeating submatrix pattern corresponds to a first matrix partition and a second matrix partition of the plurality of matrix partitions. The technique 800 includes compiling (block 808) instructions that are to be executed by a processing core to perform operations corresponding to the multiplication of the matrix with an input vector to provide an output vector. The input vector includes a first vector partition and a second vector partition. Compiling the instructions includes providing instructions to cause the processing core to, in a first pass, cause matrix values corresponding to the repeating submatrix pattern to be loaded into an analog multiplication crossbar, and read first data, provided by the analog multiplication crossbar, representing a product of the first matrix partition and the first vector partition; in a second pass, read second data, provided by the analog multiplication crossbar, representing a product of the second matrix partition and the second vector partition; and combine the first data and the second data to generate at least part of the output vector.

Figure 9:
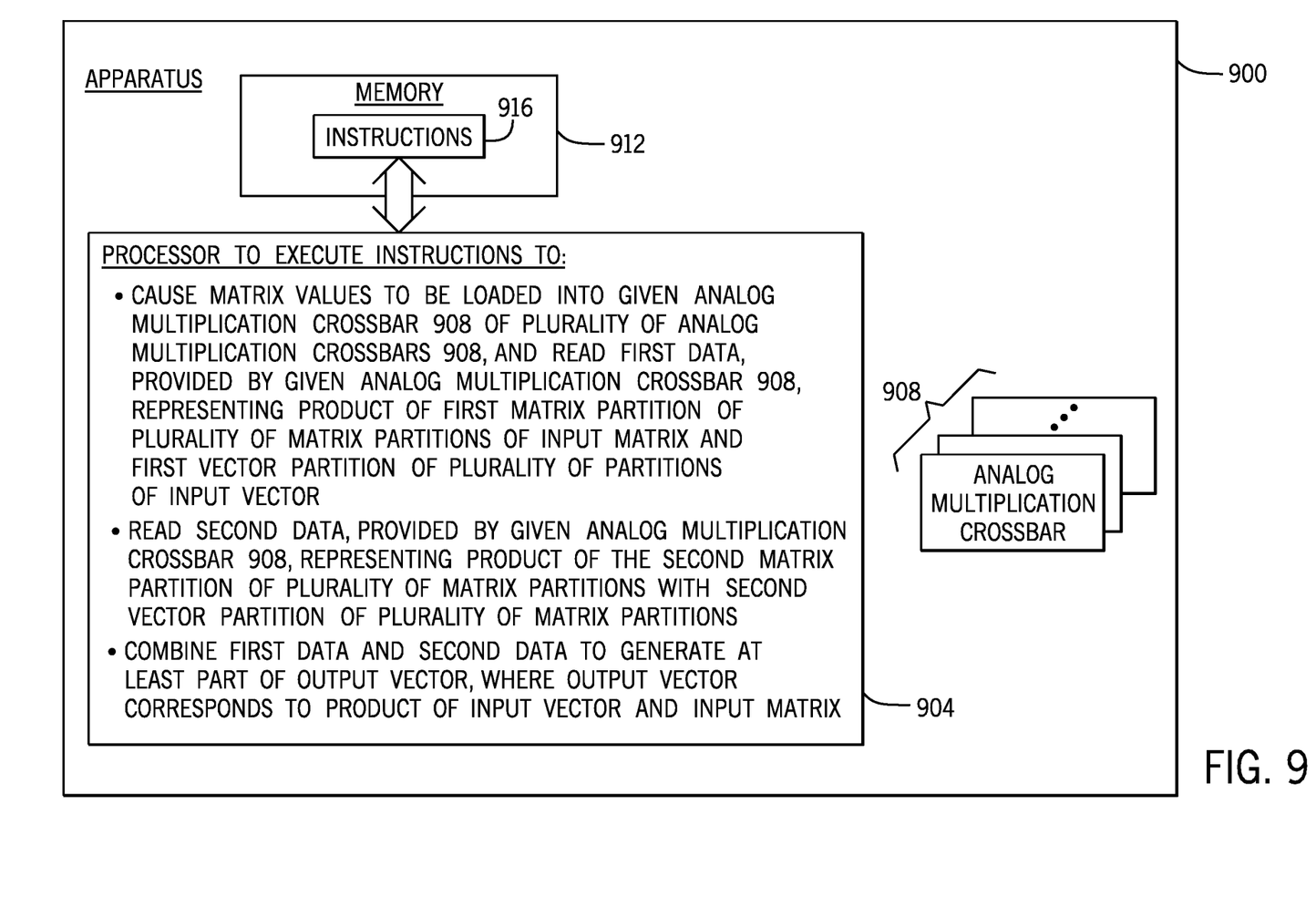
FIG. 9 is a schematic diagram of an apparatus having a processor to execute instructions to cause the processor to use an analog multiplication crossbar to provide data representing products associated with repeating submatrix patterns according to an example implementation.

Referring to FIG. 9, an apparatus 900 includes a processing core 904; a plurality of analog multiplication crossbars 908, which are associated with the processing core 904; and a memory 912 to store instructions 916. The instructions 916, when executed by the processing core 904, cause the processing core 904 to cause matrix values to be loaded into a given analog multiplication crossbar 908 of a plurality of analog multiplication crossbars 908, and read first data, provided by the given analog multiplication crossbar 908, representing a product of a first matrix partition of a plurality of matrix partitions of an input matrix and a first vector partition of a plurality of partitions of an input vector. The instructions 916, when executed by the processing core 904, further cause the processing core 904 to read second data, provided by the given analog multiplication crossbar 908, representing a product of a second matrix partition of the plurality of matrix partitions and a second vector partition of the plurality of vector partitions of the input vector; and combine the first data and the second data to generate at least part of an output vector. The output vector corresponds to the product of the input vector and the input matrix.

In accordance with example implementations, identifying the repeating submatrix pattern includes determining a first signature for the first matrix, determining a second signature for the second matrix partition, and comparing the first signature with the second signature to determine if the first signature is the same as the second signature. A particular advantage of determining signatures for partitions is that the signatures may be used to identify repeating submatrix patterns for purposes of optimizing analog multiplication crossbar allocation.

In accordance with example implementations, determining the first signature includes determining a first hash value; determining the second signature includes determining a second hash value; and comparing the first signature with the second signature includes comparing the first hash value with the second hash value to determine if the first hash value is the same as the second hash value. A particular advantage of using hash values for signatures is that the selectiveness of hash values allows repeating submatrix patterns to be efficiently identified.

In accordance with example implementations, in response to determining that the first hash value is the same as the second hash value, an element-by-element comparison may be performed, and this comparison includes comparing the first matrix with the second matrix partition to determine if the first matrix is the same as the second matrix partition. The repeating submatrix pattern may be identified in response to determining that the first matrix is the same as the second matrix partition. A particular advantage of performing the element-by-element comparison of partitions is that repeating submatrix patterns may be readily identified for corresponding clashing hash values.

In accordance with example implementations, the analog multiplication crossbar may be one of a plurality of analog multiplication crossbars, which are associated with the processing core. Compiling the instructions may further include assigning a first data structure that includes entries representing a mapping of the plurality of partitions to the plurality of analog multiplication crossbars. The entries of the data structure may include a first entry and a second entry. The first entry includes data that represents a location of the first matrix in the matrix, and an identifier that corresponds to the analog multiplication crossbar, and a count value assigning the first matrix to the analog multiplication crossbar for the first pass. The second entry includes data that represents a location of the second matrix partition in the matrix, the identifier corresponding to the analog multiplication crossbar, and a count value assigning the second matrix partition to the analog multiplication crossbar for the second pass. The instructions may be generated based on the first data structure. The first data structure is particularly advantageous for efficiently allocating analog multiplication crossbars.

In accordance with example implementations, the first pass and the second pass correspond to outputs representing products, which are provided by the plurality of analog multiplication crossbars. Compiling the instructions may further include assigning a second data structure that includes entries, which represent a mapping between the plurality of passes and the entries of the first data structure. The entries of the second data structure may include a first entry and a second entry. The first entry corresponds to the first pass and includes data that represents first pointers to the entries of the first data structure corresponding to partitions to be processed in the first pass. The second entry includes data that represents second pointers to the entries of the first data structure corresponding to partitions to be processed in the second pass. The instructions may be generated based on the second data structure. The second data structure may be particularly advantageous for efficiently optimizing allocation of analog multiplication crossbars for matrix-vector multiplication.

In accordance with example implementations, the analog multiplication crossbar may be one of a plurality of analog multiplication crossbars that are associated with the processing core. The multiplication of the matrix with the input vector may be associated with a plurality of products, where the plurality of products includes a first product corresponding to a given vector partition of the vector and a given partition of the plurality of partitions, and a second product that also corresponds to the given vector partition and the given partition. Compiling the instructions may further include generating the instructions to store and reuse the first product in lieu of using an analog multiplication crossbar to provide the second product. Reusing multiplication products has the particular advantage of allowing more efficient allocation of the analog multiplication crossbars.

In accordance with example implementations, the analog multiplication crossbar is one of a plurality of analog multiplication crossbars that are associated with the processing core. The multiplication of the matrix with the input vector may be associated with a plurality of products. Compiling the instructions may further include identifying a given submatrix pattern as corresponding to an identify matrix or a zero matrix. Compiling the instructions may also include generating the instructions to bypass using the plurality of analog multiplication crossbars to determine a given product corresponding to the given submatrix pattern in response to determining that the given submatrix pattern is the identify matrix or the zero matrix. A particular advantage of bypassing analog multiplication crossbars for products corresponding to the identity matrix or the zero matrix is that the analog multiplication crossbars may be efficiently allocated, as the products may be derived without the use of the analog multiplication crossbars.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. A non-transitory storage medium that stores machine-readable instructions that, when executed by a machine, cause the machine to:

identify repeating patterns in a matrix; and based on the identification, generate instructions executable by processing cores of a dot product engine to allocate analog multiplication crossbars of the dot product engine to perform multiplication of the matrix with a vector.

2. The storage medium of claim 1, wherein the instructions, when executed by the machine, further cause the machine to:
determine a first hash value for a first partition of a plurality of partitions of the matrix;
determine a second hash value for a second partition of the plurality of partitions;
compare the first hash value to the second hash value; and
identify whether the first partition and the second partition correspond to a repeating pattern of the repeating patterns, wherein the identification comprises determining if the second partition comprises a second instance of the first partition based on a result of the comparison.

3. The storage medium of claim 2, wherein the instructions, when executed by the machine, further cause the machine to:
in response to determining the first hash value is the same as the second hash value, perform an element-by-element comparison of the first partition with the second partition to determine whether the second partition is the second instance of the first partition.

4. The storage medium of claim 1, wherein:
the repeating patterns comprises a submatrix pattern associated with a first partition and associated with a second partition of a plurality of partitions of the matrix; and
the instructions, when executed by the machine, further cause the machine to:
assign a first data structure comprising entries representing a mapping of the plurality of partitions of the matrix to the analog multiplication crossbars, wherein the entries of the data structure comprise:
a first entry comprising data representing a location of the first partition in the matrix, an identifier corresponding to a given analog multiplication crossbar of the analog multiplication crossbars, and a count value designating the given analog multiplication crossbar to be used to multiply the first partition in a first pass; and
a second entry comprising data representing a location of the second partition in the matrix, the identifier corresponding to the given analog multiplication crossbar, and a count value designating the given analog multiplication crossbar to be used to multiply the second partition in a second pass; and
generate the instructions based on the first data structure.

5. The storage medium of claim 4, wherein:
the instructions, when executed by the machine, further cause the machine to:
assign a second data structure comprising entries representing a mapping between the first and second passes and the entries of the first data structure, wherein the entries of the second data structure comprise:
a first entry corresponding to the first pass and comprising data representing first pointers to the entries of the first data structure corresponding to partitions of the plurality of partitions to be processed in the first pass; and
a second entry corresponding to the second pass and comprising data representing second pointers to the entries of the first data structure corresponding to partitions of the plurality of partitions to be processed in the second pass; and
further generate the instructions based on the second data structure.

6. A method comprising:
identifying a repeating submatrix pattern of a plurality of submatrix patterns corresponding to a plurality of matrix partitions of a matrix, wherein the repeating submatrix pattern corresponds to a first matrix partition and a second matrix partition of the plurality of matrix partitions; and
compiling instructions to be executed by a processing core to perform operations corresponding to a multiplication of the matrix with an input vector to provide an output vector, wherein the input vector comprises a first vector partition and a second vector partition, and compiling the instructions comprises providing instructions to cause the processing core to:
in a first pass, cause matrix values corresponding to the repeating submatrix pattern to be loaded into an analog multiplication crossbar, and read first data, provided by the analog multiplication crossbar, representing a product of the first matrix partition and the first vector partition;
in a second pass, read second data, provided by the analog multiplication crossbar, representing a product of the second matrix partition and the second vector partition; and
combine the first data and the second data to generate at least part of the output vector.

7. The method of claim 6, wherein identifying the repeating submatrix pattern comprises determining a first signature for the first matrix partition, determining a second signature for the second matrix partition, and comparing the first signature with the second signature to determine if the first signature is the same as the second signature.

8. The method of claim 7, wherein determining the first signature comprises determining a first hash value, determining the second signature comprises determining a second hash value, and comparing the first signature with the second signature comprises comparing the first hash value with the second hash value to determine if the first hash value is the same as the second hash value.

9. The method of claim 8, further comprising, in response to determining the first hash value is the same as the second hash value, performing an element-by-element comparison of the first matrix partition with the second matrix partition to determine if the first matrix partition is the same as the second matrix partition, and in response to determining that the first matrix partition is the same as the second matrix partition, identifying the repeating submatrix pattern.

10. The method of claim 6, wherein:
the analog multiplication crossbar is one of a plurality of analog multiplication crossbars associated with the processing core; and
compiling the instructions further comprises:
assigning a first data structure comprising entries representing a mapping of the plurality of partitions to the plurality of analog multiplication crossbars, wherein the entries of the first data structure comprise:
a first entry comprising data representing a location of the first matrix partition in the matrix, an identifier corresponding to a given analog multiplication crossbar of the plurality of analog multiplication crossbars, and a value representing assignment of the first matrix partition to the given analog multiplication crossbar for the first pass; and a second entry comprising data representing a location of the second matrix partition in the matrix, the identifier corresponding to the given analog multiplication crossbar, and a value representing assignment of the second matrix partition to the given analog multiplication crossbar for the second pass; and generating the instructions based on the first data structure.

11. The method of claim 10, wherein:

the first pass and the second pass are part of a plurality of passes, wherein each pass of the plurality of passes corresponds to reading outputs from the plurality of analog multiplication crossbars representing products provided by the plurality of analog multiplication crossbars; and compiling the instructions further comprises:

assigning a second data structure comprising entries representing a mapping between the plurality of passes and the entries of the first data structure, wherein the entries of the second data structure comprise:

a first entry corresponding to the first pass and comprising data representing first pointers to the entries of the first data structure corresponding to matrix partitions of the plurality of matrix partitions to be processed in the first pass; and a second entry corresponding to the second pass and comprising data representing second pointers to the entries of the first data structure corresponding to matrix partitions of the plurality of matrix partitions to be processed in the second pass; and generating the instructions based on the second data structure.

12. The method of claim 6, wherein:

the analog multiplication crossbar is one of a plurality of analog multiplication crossbars associated with the processing core;

the multiplication of the matrix with the input vector is associated with a plurality of products, wherein the plurality of products comprises a first product corresponding to a given vector partition of the input vector and a given matrix partition of the plurality of matrix partitions, and a second product corresponding to the given vector partition and the given matrix partition; and compiling the instructions further comprises generating the instructions to store and reuse the first product in lieu of using an analog multiplication crossbar of the plurality of analog multiplication crossbars to provide the second product.

13. The method of claim 6, wherein:

the analog multiplication crossbar is one of a plurality of analog multiplication crossbars associated with the processing core;

the multiplication of the matrix with the input vector is associated with a plurality of products; and compiling the instructions further comprises:

identifying a given submatrix pattern of the plurality of submatrix patterns as corresponding to an identity matrix or a zero matrix; and generating the instructions to bypass using the plurality of analog multiplication crossbars to determine a given product of the plurality of products corresponding to the given submatrix pattern in response to determining that the given submatrix pattern is the identity matrix or the zero matrix.

14. The method of claim 6, wherein combining the first data and the second data to generate at least part of the output vector comprises using the first data to provide a first part of a given segment of the output vector and using the second data to provide a second part of the given segment of the output vector, and the given segment corresponds to a particular dimension of a plurality of dimensions of the output vector.

15. An apparatus comprising:

a processing core;

a plurality of analog multiplication crossbars associated with the processing core; and a memory to store instructions that, when executed by the processing core, cause the processing core to:

cause matrix values to be loaded into a given analog multiplication crossbar of a plurality of analog multiplication crossbars, and read first data, provided by the given analog multiplication crossbar, representing a product of a first matrix partition of a plurality of matrix partitions of an input matrix and a first vector partition of a plurality of partitions of an input vector;

read second data, provided by the given analog multiplication crossbar, representing a product of a second matrix partition of the plurality of matrix partitions and a second vector partition of the plurality of vector partitions of the input vector; and combine the first data and the second data to generate at least part of an output vector, wherein the output vector corresponds to a product of the input vector and the input matrix.

16. The apparatus of claim 15, further comprising:

a plurality of additional processing cores; and pluralities of additional analog multiplication crossbars, wherein the pluralities of additional processing cores execute additional instructions to perform operations to determine products corresponding to the product of the input matrix and the input vector.

17. The apparatus of claim 15, wherein:

the given analog multiplication crossbar comprises a memristor array;

the memristor array stores conductances;

the loading of the matrix values into the given analog multiplication crossbar causes the conductances to be set to values corresponding to the matrix values;

the memristor array comprises column lines to provide first currents representing the first data and provide second currents representing the second data; and the memristor array comprises row lines, wherein the row lines receive analog voltages corresponding to the first vector partition to cause the memristor array to provide the first currents, and the row lines receive analog voltages corresponding to the second vector partition to cause the memristor array to provide the second currents.

18. The apparatus of claim 15, wherein the instructions, when executed by the processing core, further cause the processing core to determine a first signature for the first matrix partition, determine a second signature for the second matrix partition, compare the first signature with the second signature, and determine that the first matrix partition corresponds to the matrix that is identical to the second matrix partition based on the comparison.

19. The apparatus of claim 15, wherein:
the product of the input matrix with the input vector is associated with a plurality of products, wherein the plurality of products comprises a first product corresponding to a given vector partition of the input vector and a given matrix partition of the plurality of matrix partitions, and a second product that also corresponds to the given vector partition and the given matrix partition; and
the instructions, when executed by the processing core, further cause the processing core to store and reuse the first product in lieu of using an analog multiplication crossbar of the plurality of analog multiplication crossbars to provide the second product.

20. The apparatus of claim 15, wherein the instructions, when executed by the processing core, further cause the processing core to use the first data to provide a first part of a given segment of the output vector and use the second data to provide a second part of the given segment of the output vector, and the given segment corresponds to a particular dimension of a plurality of dimensions of the output vector.

\* \* \* \* \*